United States Patent [19]

Iino et al.

[11] Patent Number: 5,667,588
[45] Date of Patent: Sep. 16, 1997

[54] SINGLE CRYSTAL PULLING APPARATUS

[75] Inventors: Eiichi Iino; Kiyataka Takano; Masanori Kimura; Koji Mizuishi; Hirotoshi Yamagishi, all of Gunma-ken, Japan

[73] Assignee: Shin-Etsu Handotai Co., Ltd., Tokyo, Japan

[21] Appl. No.: 658,275

[22] Filed: Jun. 5, 1996

[30] Foreign Application Priority Data

Jun. 10, 1995 [JP] Japan .................. 7-168164

[51] Int. Cl.$^6$ .................. C30B 35/00
[52] U.S. Cl. .................. 117/217; 117/208; 117/218; 117/900
[58] Field of Search .................. 117/200, 208, 117/215, 216, 217, 218, 900

[56] References Cited

U.S. PATENT DOCUMENTS

| 5,004,519 | 4/1991 | Hariri .................. 117/900 |
| 5,096,677 | 3/1992 | Katsuoka et al. .................. 117/217 |
| 5,254,319 | 10/1993 | Oda et al. .................. 117/218 |

FOREIGN PATENT DOCUMENTS

| 0 389 284 | 9/1990 | European Pat. Off. . |
| 0 590 964 | 4/1994 | European Pat. Off. . |
| 01 246191 | 12/1989 | Japan . |
| 4202084A | 7/1992 | Japan .................. 117/218 |

OTHER PUBLICATIONS

IBM Technical Disclosure Bulletin Bochman et al. Jun. 1970.

Primary Examiner—Felisa Garrett
Attorney, Agent, or Firm—Ronald R. Snider

[57] ABSTRACT

Arranged is a covering plate which closes and opens an entrance of a valve container between a lower chamber and an upper chamber, the lower chamber containing a crucible and the upper chamber containing a wire to pull a single crystal. The covering plate is contained in a circle-shaped space portion within a wall by closing and opening means. The covering plate closes the entrance so that an isolation valve is protected. Since at the time of opening the entrance the covering plate is contained within the wall without contacting with the wall, the fall of dusts produced by peeling off of a film deposited on the wall can be prevented. Furthermore, the covering plate is contained in a circle-shaped space portion without exposing the front and back surfaces thereof to the air.

3 Claims, 6 Drawing Sheets (a)  (b)

SINGLE CRYSTAL PULLING APPARATUS present disclosure relates to subject matter contained in Japanese patent application No. 168164/1995 (filed on Jun. 10, 1995) which is expressly incorporated herein by reference in its entirety.

BACKGROUND OF THE INVENTION

1. Field of the Invention

The present invention relates to a single crystal pulling apparatus which pulls a silicon single crystal and the like by Czochralski method (hereinafter referred to as CZ method), more particularly to a single crystal pulling apparatus which is suitable for preventing from generation of dislocations in a single crystal due to dusts attached to isolation valves and the apparatus.

2. Description of the Prior Art

As shown in FIG. 8 prior art, a single crystal pulling apparatus 1b to grow a single crystal by the CZ method comprises for the most part a lower chamber 18, an upper chamber 22, and a valve containing portion 24. The lower chamber 18 accommodates a quartz crucible 15 for storing a silicon melt 14, a heater 16 serving as a heating means, and a heat insulating material 17 and the like. The upper chamber 22 accommodates a wire 21 and a driving mechanism (not shown) for pulling the single crystal 19 via a seed crystal 20. The valve containing portion 24, which is disposed between chambers 18 and 22, accommodates an isolation valve 23 which shuts off chambers 18 and 22.

The isolation valve 23 has a shape such that the valve 23 closes and opens an upper opening portion 25 of the lower chamber 18, and comprises a seal means, a cooling means, and a vacuum keeping means and the like. When the grown single crystal 19 is taken out from the apparatus 1b, the grown single crystal 19 is lifted up above the isolation valve 23, and at this situation the upper opening portion 25 of the lower chamber 18 is closed by the isolation valve 23. Keeping the lower chamber 18 at a reduced pressure condition, the upper chamber 22 is restored to a normal pressure, and the single crystal 19 is taken out from the apparatus 1b.

After, the pressure of the upper chamber 22 is reduced, and the isolation valve 23 is opened, pulling of the single crystal 9 is carried out.

However, as the diameter of the single crystal 19 to be grown is larger, the isolation valve 23 also becomes larger. The structure of the valve 23 is apt to be more complicated. On the other hand, a temperature in the single crystal pulling apparatus is high. SiO gas is generated from the melt in the crucible. The SiO gas diffused toward upper direction and deposits on the inner wall of the apparatus so that a film is formed. Exfoliation of this film causes dusts. Furthermore, the SiO gas invades into the valve containing portion 24. A film is also formed on the isolation valve 23 and this film causes dusts. In case the above dusts fall into the crucible 15, the single crystal 19 formes dislocations therein furthermore, heating the isolation valve 23 damages the sealing means, the cooling means, and the vacuum keeping means.

There is a technology disclosed in Japanese Patent Application Laid Open No. 24619/1989 as a prior art to solve the foregoing problems. The single crystal pulling apparatus disclosed in the above literature has a structure that a closing cylinder for closing the entrance of an isolation valve is disposed, at a lowermost portion of an upper chamber, movably up and down along an inner wall of the upper chamber. This prior art prevents the attachments of the dusts to the isolation valve.

As described above, the closing cylinder moves upwardly and downward along the inner wall of the upper chamber so that the dusts originated from exfoliation of a film formed on the inner wall of the upper chamber will fall in a crucible with the motion of the closing cylinder. For this reason, the crystal being formed has dislocations so that inferior goods may be produced. Thus, reduction in productivity and high cost will be brought about.

SUMMARY OF THE INVENTION

To solve the foregoing problems, the object of the present invention is to provide a single crystal pulling apparatus which is capable of increasing the productivity and reducing the cost, by reducing amount of dusts due to exfoliation of a film which is formed by a deposition of SiO and by preventing the formation of dislocations in the single crystal due to the falling of dusts.

Accordingly the first aspect of the present invention, in a single crystal pulling apparatus which comprises a lower chamber accommodating a crucible for containing a melting liquid and a heating means for heating of the crucible, and an upper chamber accommodating a wire for pulling a single crystal from the crucible via a seed crystal and a driving mechanism for the wire thereof, and a valve containing portion which is disposed between the lower and upper chambers and accommodates an isolation valve for closing and opening an upper opening portion of the lower chamber, wherein a covering plate which should be disposed so as to cover an entrance of the isolation valve of the valve container and closing and opening means for the covering plate are arranged, and front and back surfaces of the aforementioned covering plate is not exposed to the inside of the apparatus at least at the containing position where the aforementioned entrance is opened.

The single crystal pulling apparatus of the second aspect of the present invention is characterized in that the aforementioned covering plate is disposed freely movable up and down, and is contained within the wall of the apparatus at the aforementioned containing position.

The single crystal pulling apparatus of the third aspect of the present invention is characterized in that the aforementioned covering plate is disposed rotatively at a predetermined position, and the aforementioned covering plate is contained within the wall of the apparatus at the aforementioned containing position.

According to the single crystal pulling apparatus of the first aspect of the present invention, the valve containing portion is closed by the covering plate during the growth of the single crystal so that SiO gas never invades into the valve containing portion and the isolation valve is protected. The covering plate is contained within a wall of the apparatus at the containing position so that the covering plate is never in contact with the inner wall of the apparatus. Dusts falling from the inner wall is reduced.

According to the single crystal pulling apparatus of the second and third aspects of the present invention, the covering plate is contained in a wall movably up and down as well as rotatively so that the space for containing the covering plate is reduced. Thus, the scale of the apparatus can be reduced.

BRIEF DESCRIPTION OF THE DRAWINGS

Embodiments of the present invention will now be described by way of example and with reference to the accompanying drawings, in which:

FIG. 3a is an enlarged sectional view, which shows the detailed structure of the closing and opening means of the embodiment, taken along the line A—A of FIG. 2;

FIG. 3b is a fragmentary view taken in the direction of the arrow B of FIG. 3a;

DETAILED DESCRIPTION OF THE PREFERRED EMBODIMENTS

An embodiment of the present invention will now be described with reference to the accompanying drawings.

Figure 1:
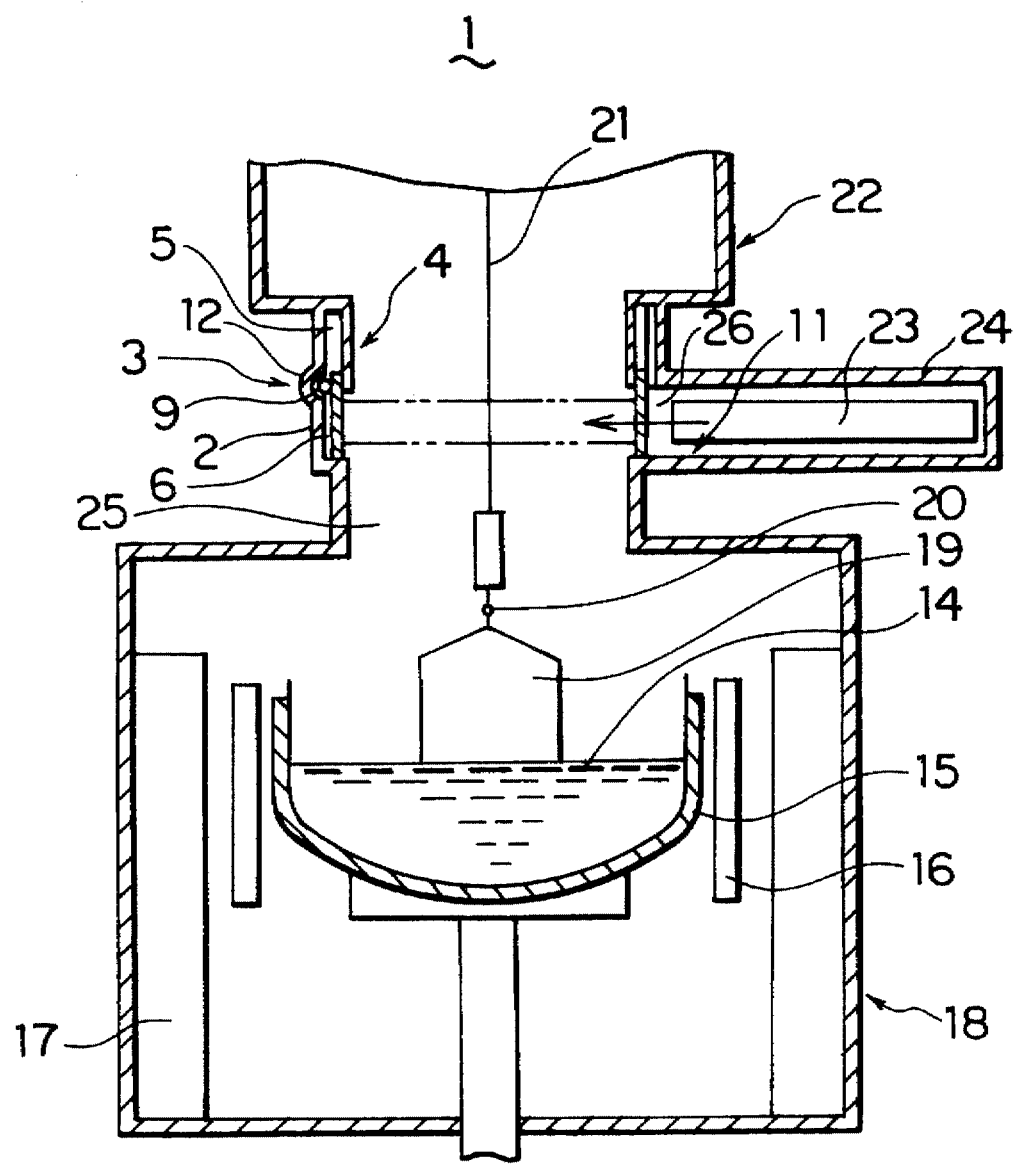
FIG. 1 is a longitudinal sectional view showing a whole structure of a preferred embodiment of a single crystal pulling apparatus according to the present invention.

As shown in FIG. 1, the single crystal pulling apparatus 1 comprises a lower chamber 18, an upper chamber 22, and a valve container 24 disposed between the lower and upper chambers 18 and 22. A crucible 15 storing silicon melt, a heater 16, and a heat insulating material 17 and the like are accommodated in the lower chamber 18. A wire 21 for pulling a single crystal 19 via a seed crystal 20 and a driving mechanism for driving the wire 21 (not shown) are accommodated in the upper chamber 22. Furthermore, an isolation valve 23 is accommodated in the valve container 24, and a covering plate 2 and a closing and opening device 3 for driving the covering plate 2 are disposed around them, the covering plate 2 being a main constitution part of this embodiment.

The covering plate 2 consists of a ring-shaped member to close and open the entrance 26 for the isolation valve 23 of the valve container 24. When closing the entrance 26, the covering plate 2 attaches its lowermost surface to the bottom surface 11 of the valve container 24 and the uppermost portion of the covering plate 2 is disposed at the lowermost of a circular spatial portion 5 formed inside the wall 4. It is noted that the height of the circular spacial portion 5 is set so that the uppermost surface of the covering plate 2 will not interfere with the uppermost portion of the circular spacial portion 5 when the covering plate 2 opens the entrance 26.

Figure 2:
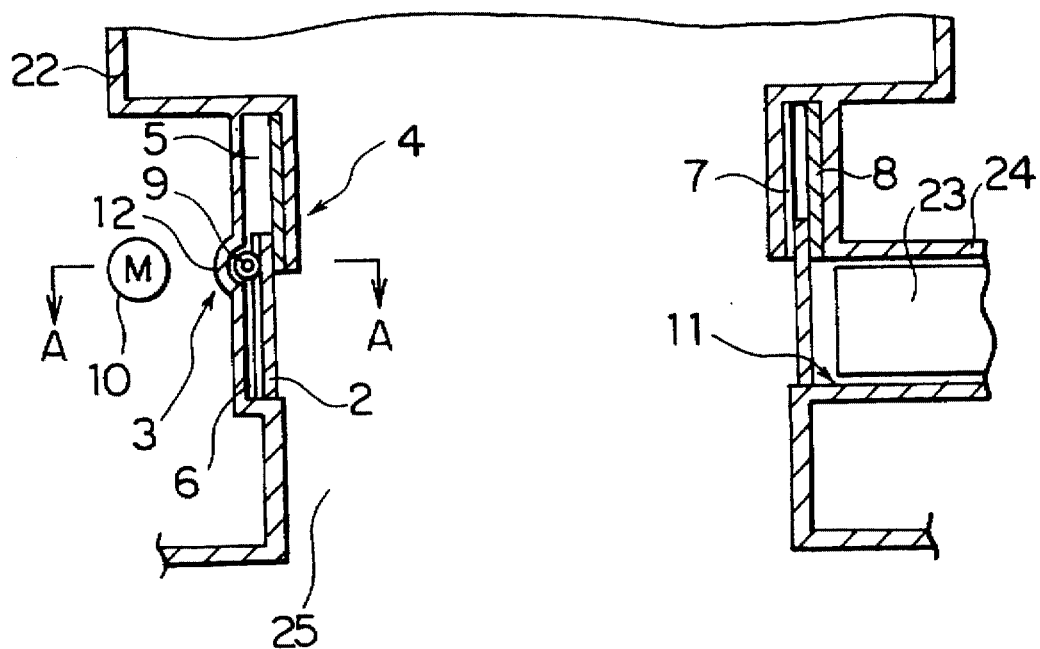
FIG. 2 is a partly longitudinal sectional view showing a detailed structure of a covering plate, which is movable up and down, and a closing and opening means for the covering plate of the above embodiment.
Figure 3:
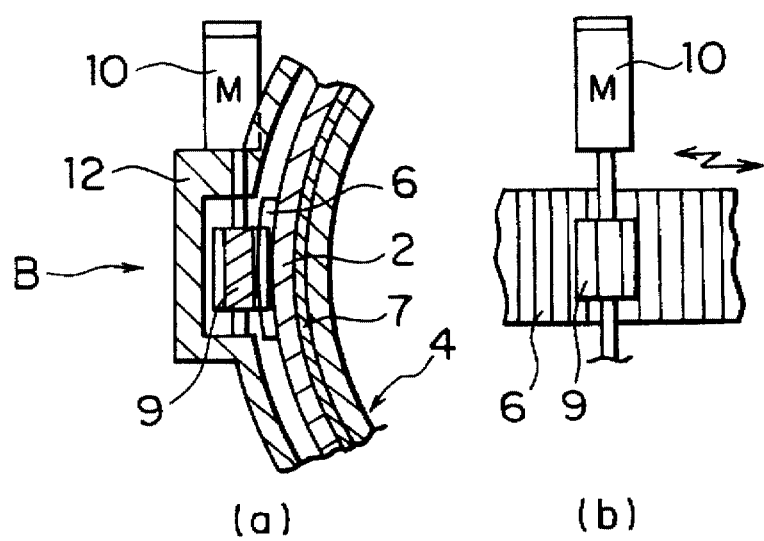

As shown in FIGS. 2, 3a, and 3b, a rack 6 is formed either by being fixed to the covering plate 2 or by being united therewith. Furthermore, guide rings 7 and 8 for supporting the covering plate 2 are inserted inside of the wall 4 tightly, the rings 7 and 8 serving so that the covering plate 2 is not shaky. It is noted that the ring 8 is a semicircular.

In this embodiment, the closing and opening device 3, as shown in FIGS. 2, 3a, and 3b, consists of a pinion gear 9 and a motor 10 to drive the pinion gear 9 and the like. The pinion gear 9 is supported by a boss portion 12 around the wall 4. The motor is fixed to the boss portion 12.

Next, an operation of the single crystal pulling apparatus of this embodiment according to the present invention will be described.

Figure 4:
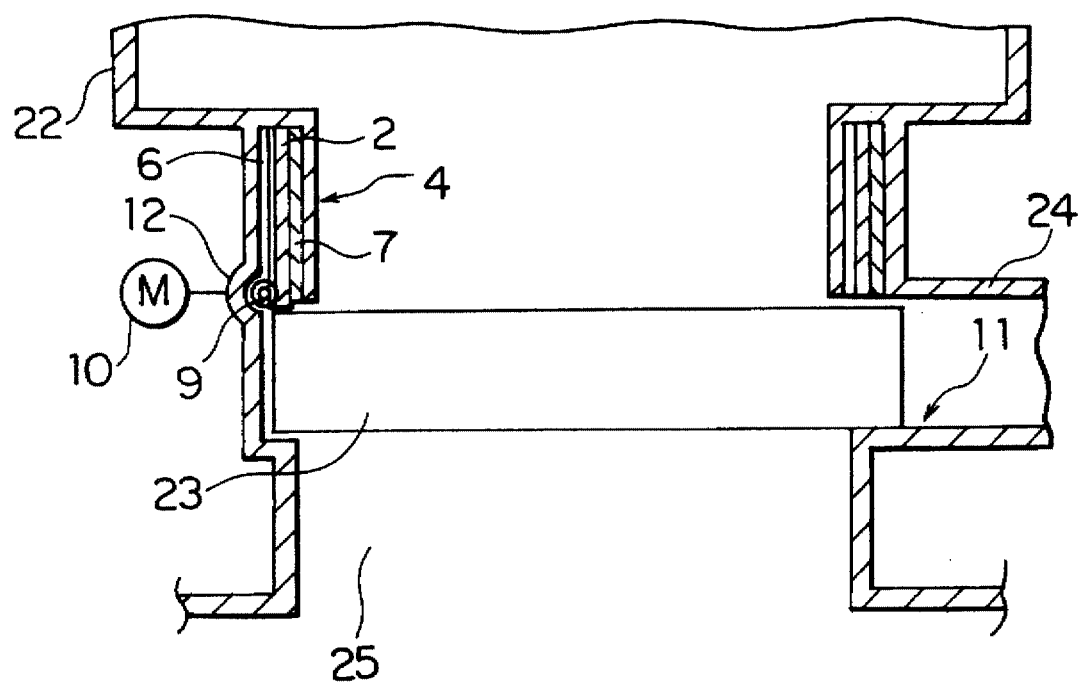
FIG. 4 is a partly longitudinal sectional view showing an opening state of the covering plate of the embodiment.

When the single crystal 19 is grown, as shown in FIGS. 1 and 2, the covering plate 2 is disposed in the lower portion to close the entrance 26. In this situation, the single crystal 19 is grown by the CZ method. In this case, since the entrance 26 of the valve container 24 is closed by the covering plate 2, the isolation valve 23 is not in contact with SiO gas. When the single crystal 19 is grown to the desired size, as shown in FIG. 4, the covering plate 2 is moved upwardly so that the entrance 26 of the valve container 24 is opened. The isolation valve 23 is moved, by a moving device (not shown), so as to close the upper opening portion 25. This situation is illustrated with two-dotted chain lines of FIG. 1.

By the above described situation, the temperature in the lower chamber 18 is kept constant, and the reduced pressure condition of the lower chamber 18 is maintained. To move the covering plate 2 upward, the motor 10 is driven to rotate the pinion gear 9 connected thereto, and the rack 6 geared with the pinion gear 9 is moved upward. With the motion of the rack 6 in the upward direction, the covering plate 2 moves upward, and is guided by the guide rings 7 and 8 so that the covering plate 2 is accommodated within the circular spatial portion 5.

As described above, the covering plate 2 is accommodated within the circular spatial portion 5 formed inside the wall 4, so that the front and back surfaces of the covering plate 2 are never exposed to the inner portion of the apparatus. Furthermore, since the inner surface of the wall 4 and the covering plate 2 are not in contact with each other, the film formed of SiO deposited on the inner surface of the wall 4 is not exfoliated therefrom. The covering plate 2 comes to be accommodated in the spatial portion 5 only by the rotation of the motor 10 so that the mechanism for accommodating the covering plate 2 in the spatial portion 5 is simple.

Figure 5:
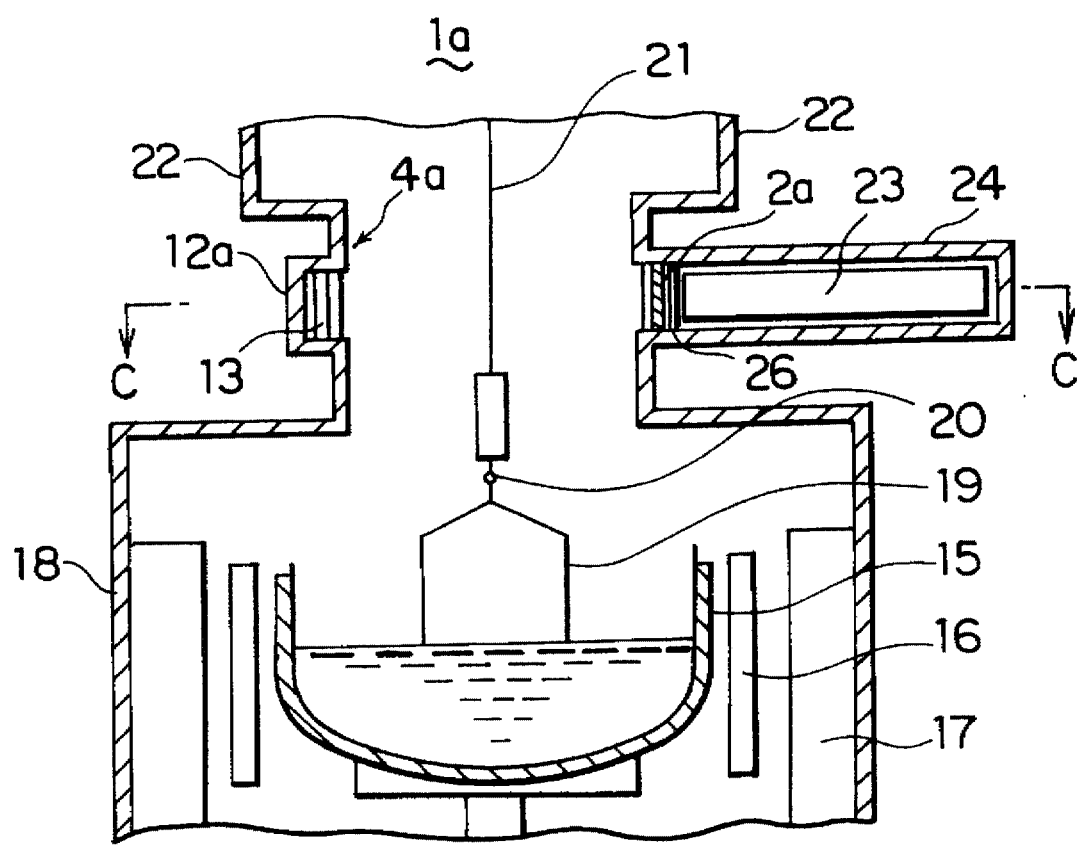
FIG. 5 is a longitudinal sectional view showing the whole structure of another embodiment of the present invention.
Figure 6:
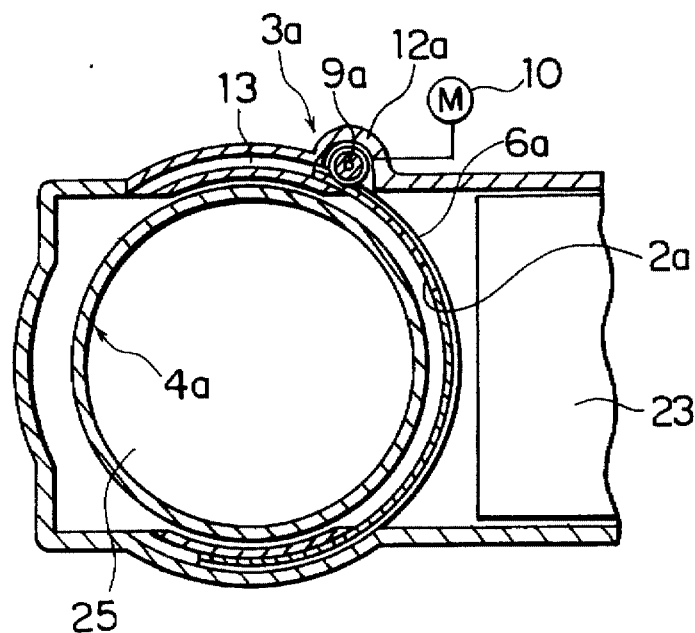
FIG. 6 is a transverse sectional view showing detailed structures of a covering plate and a closing and opening means there of taken along the line C—C of FIG. 5.

FIG. 5 shows a second embodiment of a single crystal pulling apparatus according to the present invention. The single crystal pulling apparatus 1a of the second embodiment is different from that of the first embodiment in a covering plate 2a and a closing and opening device 3a. Other portions of the single crystal pulling apparatus 1a of the second embodiment are the same as those of the first embodiment. In the second embodiment, the covering plate 2a is formed of a semicircular member, and is supported rotatively in a ring-shaped groove 13 (see FIGS. 6 and 7) which is formed inside the wall 4a. A rack 6a is fixed to the outer periphery of the covering plate 2a, or the rack 6a is formed integrated with the covering plate 2a. A closing and opening means 3a comprises a pinion gear 9a, which engages with the rack 6a, and a motor 10 to drive the gear 9a. It is noted that the pinion gear 9a and the motor 10 are supported fixedly by a boss portion 12a formed around the wall 4a.

Figure 7:
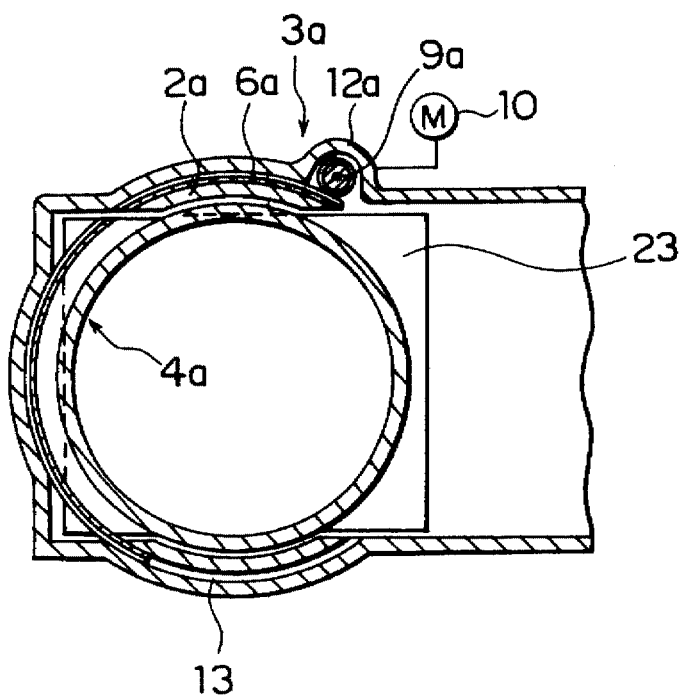
FIG. 7 is a transverse sectional view showing an opening state of the covering plate in the single crystal pulling apparatus of FIG. 5.
Figure 8:
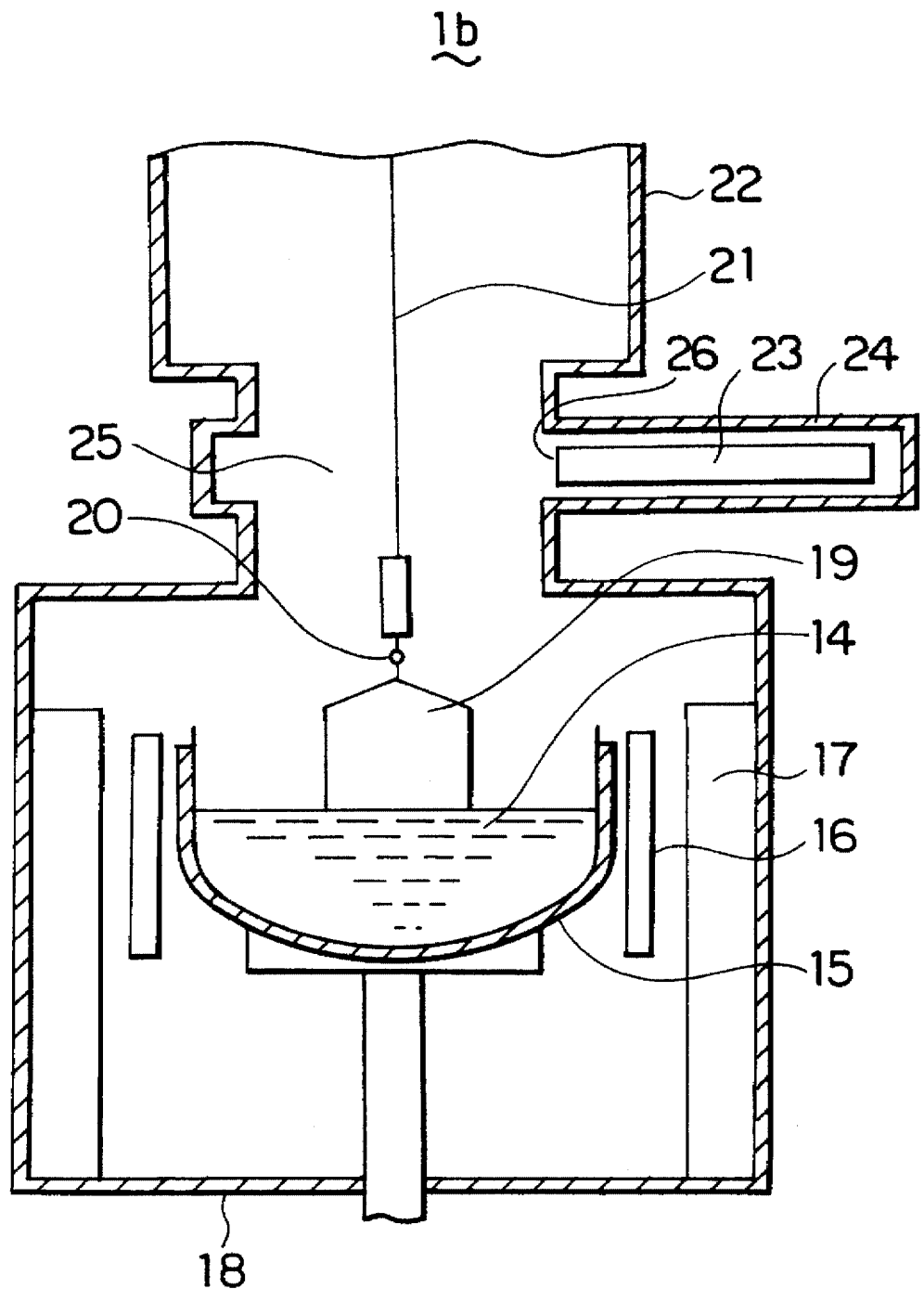

With the foregoing structure, the motor 10 is driven so that the pinion gear 9a causes the rack 6a to rotate, thereby the covering plate 2a moves along the circle-shaped groove 13. FIG. 7 illustrates such situation.

As described above, the entrance 26 of the valve container 24 is easily closed and opened only by driving the motor 10. In the foregoing description, the covering plate 2 and 2a is designed such that it is capable of moving freely up and down or rotating freely, and the closing and opening means 3 and 3a for the covering plate 2 has a simple structure including the pinion gear and the rack. The present invention is not limited to the above structure. Any structure that the covering plate is contained at the time when it is not used will suffice the object of the present invention.

According to the present invention, the following remarkable effects are obtained.

According to a single crystal pulling apparatus of the first aspect of the present invention, since a valve container, which contains an isolation valve, is closed by a covering plate at the time of a single crystal manufacturing, gas never invades into the valve container so that the isolation valve will be protected. Furthermore, when the isolation valve is closed after the single crystal manufacturing, the covering plate is contained within a wall so that it is never in contact with the inner wall of the apparatus. A film deposited on the inner wall does not peel off and does not fall. Therefore, the defective products of the single crystals due to the dislocations are not generated, and the productivity is increased and the cost is reduced.

According to a single crystal pulling apparatus of the second and third aspects of the present invention, a covering plate is contained within the wall so that the space of the apparatus is reduced. Both surface of the covering plate is not exposed to the air so that the durability is enhanced.

What is claimed is:

1. A single crystal pulling apparatus which comprises:

a lower chamber accommodating a crucible for containing a melting liquid and a heating means for heating of said crucible;

an upper chamber accommodating a wire for pulling a single crystal from said crucible via a seed crystal and a driving mechanism for said wire;

an isolation valve for closing and opening an upper opening portion of said lower chamber;

an isolation valve containing portion which is disposed between said lower and upper chambers which accommodates the isolation valve;

wherein a covering plate is disposed so as to cover an entrance of said isolation valve containing portion and;

wherein front and back surfaces of said covering plate are not exposed to the inside of the apparatus at least at a containing position where said entrance is opened.

2. A single crystal pulling apparatus which comprises:

a lower chamber accommodating a crucible for containing a melting liquid and a heating means for heating of said crucible;

an upper chamber accommodating a wire for pulling a single crystal from said crucible via a seed crystal and a driving mechanism for said wire;

an isolation valve for closing and opening an upper opening portion of said lower chamber;

an isolation valve containing portion which is disposed between said lower and upper chambers which accommodates the isolation valve;

wherein a covering plate is disposed so as to cover an entrance of said isolation containing portion valve;

opening means for said covering plate arranged wherein front and back surfaces of said covering plate are not exposed to the inside of the apparatus at least at a cover containing position where said entrance is opened; and wherein said covering plate is disposed freely movable up and down, and is contained within the wall of the apparatus at said containing position.

3. A single crystal pulling apparatus which comprises:

a lower chamber accommodating a crucible for containing a melting liquid and a heating means for heating of said crucible;

an upper chamber accommodating a wire for pulling a single crystal from said crucible via a seed crystal and a driving mechanism for said wire;

an isolation valve for closing and opening an upper opening portion of said lower chamber;

an isolation valve containing portion which is disposed between said lower and upper chambers which accommodates the isolation valve;

wherein a covering plate is disposed so as to cover an entrance of said isolation containing portion valve;

opening means for said covering plate arranged wherein front and back surfaces of said covering plate are not exposed to the inside of the apparatus at least at a cover containing position where said entrance is opened; and wherein said covering plate is disposed rotatively at a predetermined position and is contained within the wall of the apparatus at said containing position.

* * * * *